US011770907B2

(12) United States Patent
Wang

(10) Patent No.: US 11,770,907 B2
(45) Date of Patent: Sep. 26, 2023

(54) SUPPORT FILM LAYER AND FLEXIBLE DISPLAY PANEL

(71) Applicant: Wuhan China Star Optoelectronics Semiconductor Display Technology Co., Ltd., Hubei (CN)

(72) Inventor: Wenqiang Wang, Hubei (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 105 days.

(21) Appl. No.: 17/266,645

(22) PCT Filed: Nov. 23, 2020

(86) PCT No.: PCT/CN2020/130807
§ 371 (c)(1),
(2) Date: Feb. 8, 2021

(87) PCT Pub. No.: WO2022/088319
PCT Pub. Date: May 5, 2022

(65) Prior Publication Data
US 2022/0312602 A1    Sep. 29, 2022

(30) Foreign Application Priority Data
Oct. 28, 2020 (CN) .......................... 202011169161.5

(51) Int. Cl.
*B32B 3/26* (2006.01)
*H05K 5/00* (2006.01)
(Continued)

(52) U.S. Cl.
CPC ........... *H05K 5/0017* (2013.01); *B32B 3/266* (2013.01); *B32B 15/04* (2013.01); *B32B 15/18* (2013.01);
(Continued)

(58) Field of Classification Search
CPC .... H05K 5/0017; H05K 5/0018; B32B 3/266; B32B 15/04; B32B 15/18; B32B 2307/42;
(Continued)

(56) References Cited

U.S. PATENT DOCUMENTS

| 10,056,443 B2* | 8/2018 | Shyu .................. H01L 51/0097 |
| 2017/0229674 A1 | 8/2017 | Jin et al. |

(Continued)

FOREIGN PATENT DOCUMENTS

| CN | 109360499 | 2/2019 |
| CN | 110767096 | 2/2020 |

(Continued)

OTHER PUBLICATIONS

Notification of Office Action and Search Report dated Apr. 6, 2023 From the State Intellectual Property Office of the People's Republic of China Re. Application No. 202011169161.5 and Its Translation Into English. (16 Pages).

*Primary Examiner* — Megha M Gaitonde

(57) ABSTRACT

The present application discloses a support film layer and a flexible display panel. By periodically arranging at least one elliptical hollow structure and a plurality of shuttle-shaped hollow structures in a bending region of the support film layer, stress concentrations in the bending region can be weakened, which is beneficial to increase a bending lifespan of the support film layer. The present application can improve an overall ductility of the flexible display panel, increase a bending performance of the flexible display panel, reduce a risk of peeling and fracture between film layers, and increase production yields of products.

8 Claims, 9 Drawing Sheets

(51) Int. Cl.
 *B32B 15/04* (2006.01)
 *B32B 15/18* (2006.01)
(52) U.S. Cl.
 CPC ....... *B32B 2307/42* (2013.01); *B32B 2307/51* (2013.01); *B32B 2457/20* (2013.01)
(58) Field of Classification Search
 CPC ............. B32B 2307/51; B32B 2457/20; Y10T 428/24273; Y10T 428/24298; Y10T 428/24314; Y10T 428/24331; Y10T 428/24479; Y10T 428/2457; Y10T 428/24942
 USPC ........ 428/131, 134, 136, 156, 167, 212, 220
 See application file for complete search history.

(56) References Cited

U.S. PATENT DOCUMENTS

| | | | |
|---|---|---|---|
| 2020/0174519 A1 | 6/2020 | Huang | |
| 2021/0086469 A1* | 3/2021 | Cosgrove | ............ H01L 51/0097 |
| 2021/0165454 A1* | 6/2021 | Dong | ...................... B32B 3/266 |

FOREIGN PATENT DOCUMENTS

| | | | | |
|---|---|---|---|---|
| CN | 110992828 | * | 4/2020 | |
| CN | 211742521 | | 10/2020 | |
| WO | WO-2019018253 A1 | * | 1/2019 | ............. B32B 27/32 |

\* cited by examiner

SUPPORT FILM LAYER AND FLEXIBLE DISPLAY PANEL

RELATED APPLICATIONS

This application is a National Phase of PCT Patent Application No. PCT/CN2020/130807 having International filing date of Nov. 23, 2020, which claims the benefit of priority of Chinese Patent Application No. 202011169161.5 filed on Oct. 28, 2020. The contents of the above applications are all incorporated by reference as if fully set forth herein in their entirety.

FIELD AND BACKGROUND OF THE INVENTION

The present application is related to the field of display technology, and specifically, to a support film layer and a flexible display panel.

In recent years, organic light-emitting diode (OLED) display technology has become mature. OLED modules are based on light-emitting diode (LED) technology, and their thickness has been significantly reduced, which makes commercialization of flexible displays possible.

In recent years, various terminal manufacturers have successively launched flexible folding and rollable display electronic products, but prices are relatively high, resulting in relatively low product popularity. Low production yields of the flexible displays are a main reason of this circumstance. In a current stage of production processes of flexible display modules, peeling, fracture, and failure frequently occur between film materials of module lamination structure, which directly affect lifespans and production yields of products. Generally, in a typical OLED module lamination structure, in order to ensure an overall flatness of the module, material of a bottom layer adjacent to the lamination structure usually adopts a thinner stainless-steel plate (SUS, a stainless-steel code) as a support layer.

However, because a modulus of the support layer is significantly different from film layers and an adhesive layer, which are usually 100 to 1000 times different, peeling often occurs between the film layers caused by uncoordinated deformations of forces during a bending process. In order to resolve this failure, a bending region of an entire support layer is usually formed with a grid shape, which is a patterned structure. Compared with providing an entire surface of the SUS, this solution effectively solves the peeling problem, but in a long-term bending fatigue test (folding times>200,000 times), partial fracture often occurs. This fracture problem directly affects lifespans of OLED modules.

SUMMARY OF THE INVENTION

The present application provides a support film layer and a flexible display panel to solve a problem of partial fracture occurring to the support film layer in a long-term bending fatigue test.

In a first aspect, the present application provides a support film layer. The support film layer includes a bending region. The bending region includes at least one elliptical hollow structure and a plurality of shuttle-shaped hollow structures, which are arranged periodically. The elliptical hollow structure and the shuttle-shaped hollow structures have a same width direction. The elliptical hollow structure and the shuttle-shaped hollow structures have a same length direction. The width direction is a bending direction of the support film layer. Each of the shuttle-shaped hollow structures includes a first semi-elliptical hollow structure, a rectangular hollow structure, and a second semi-elliptical hollow structure, which are sequentially connected to each other along the length direction. In the length direction, the elliptical hollow structure is disposed between two adjacent first semi-elliptical hollow structures and/or second semi-elliptical hollow structures. In the width direction, the elliptical hollow structure is disposed between two adjacent rectangular hollow structures.

Based on the first aspect, in a first embodiment of the first aspect, the first semi-elliptical hollow structure is same as half of the elliptical hollow structure in the length direction, and the second semi-elliptical hollow structure is same as another half of the elliptical hollow structure in the length direction.

Based on the first aspect, in a second embodiment of the first aspect, a width of the rectangular hollow structure is twice that of a semi-minor axis of the elliptical hollow structure.

Based on the first aspect, in a third embodiment of the first aspect, in the length direction, a distance between adjacent two of the elliptical hollow structures and the first semi-elliptical hollow structure or the second semi-elliptical hollow structure ranges from 100 μm to 240 μm.

Based on the first aspect, in a fourth embodiment of the first aspect, in the width direction, a distance between two adjacent rectangular hollow structures ranges from 60 μm to 140 μm.

Based on the first aspect, in a fifth embodiment of the first aspect, semi-minor axes of the elliptical hollow structure, the first semi-elliptical hollow structure, and the second semi-elliptical hollow structure range from 0.08 mm to 0.12 mm.

Based on the first aspect, in a sixth embodiment of the first aspect, semi-major axes of the elliptical hollow structure, the first semi-elliptical hollow structure, and the second semi-elliptical hollow structure range from 0.1 mm to 0.25 mm.

Based on the first aspect, in a seventh embodiment of the first aspect, a length of the rectangular hollow structure ranges from 2.7 mm to 5.2 mm.

Based on any one of the above embodiments of the first aspect, in an eighth embodiment of the first aspect, the support film layer further includes non-bending regions on two opposite sides of the bending region.

In a second aspect, the present application provides a flexible display panel including a flexible substrate and the support film layer according to any one of the above embodiments disposed on a side of the flexible substrate.

Based on the second aspect, in a first embodiment of the second aspect, the flexible display panel further includes a protective film layer. The protective film layer is disposed on a side of the support film layer away from the flexible substrate. The protective film layer at least covers the bending region of the support film layer.

Based on the second aspect, in a second embodiment of the second aspect, the protective film layer is a linear elastic material.

Based on the second aspect, in a third embodiment of the second aspect, the flexible display panel further includes a buffer layer. The buffer layer is disposed between the flexible substrate and the support film layer. The buffer layer includes a superelastic material.

In the support film layer and the flexible display panel provided by the present application, by periodically arranging at least one elliptical hollow structure and the plurality of shuttle-shaped hollow structures in the bending region of the support film layer, stress concentrations in the bending region can be weakened, which is beneficial to increase a bending lifespan of the support film layer. The present application can improve an overall ductility of the flexible display panel, increase a bending performance of the flexible display panel, reduce a risk of peeling and fracture occurring between film layers, and increase production yields of products.

DESCRIPTION OF SPECIFIC EMBODIMENTS OF THE INVENTION

In order to make purposes, technical solutions, and effects of the present application clearer and more specific, the present application is further described in detail below with reference to the accompanying drawings and examples. It should be understood that the specific embodiments described herein are only used to explain the application, and are not used to limit the present application.

Figure 2:
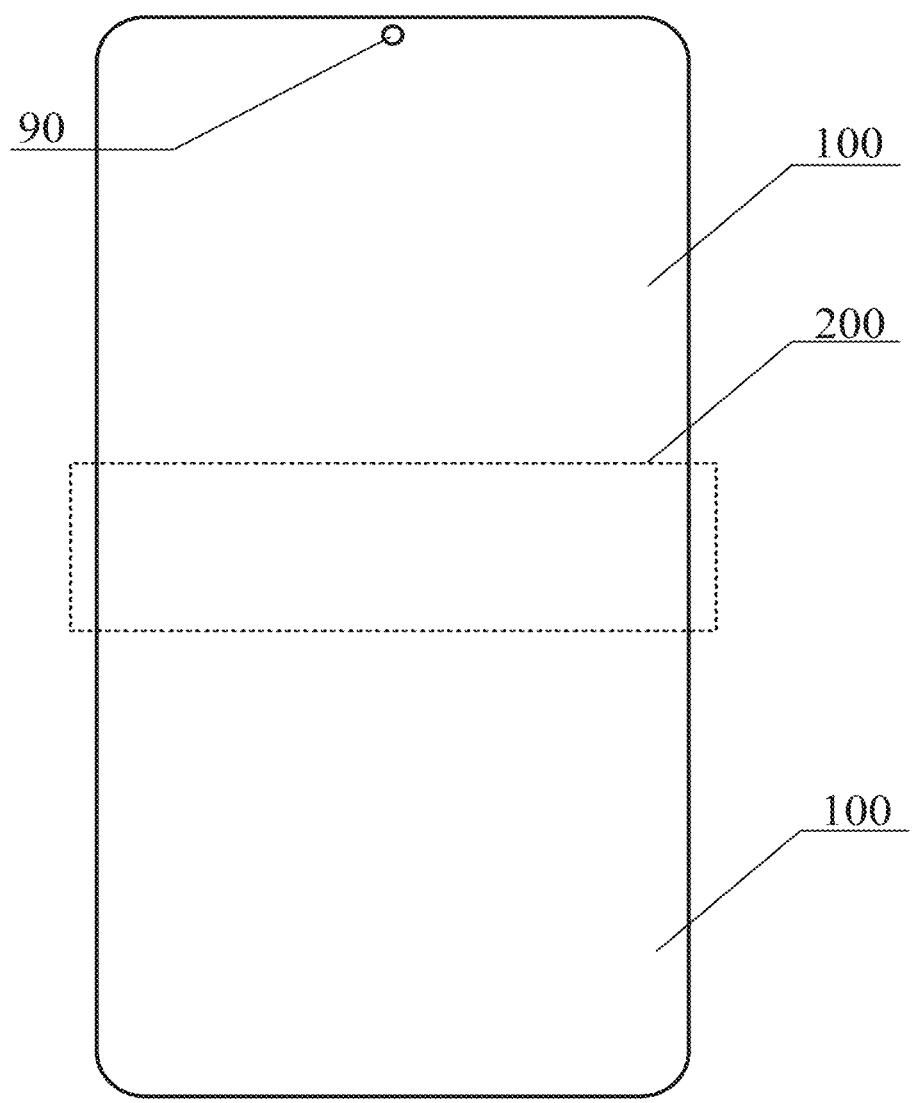
FIG. 2 is a structural schematic diagram of a support film layer in FIG. 1.
Figure 3:
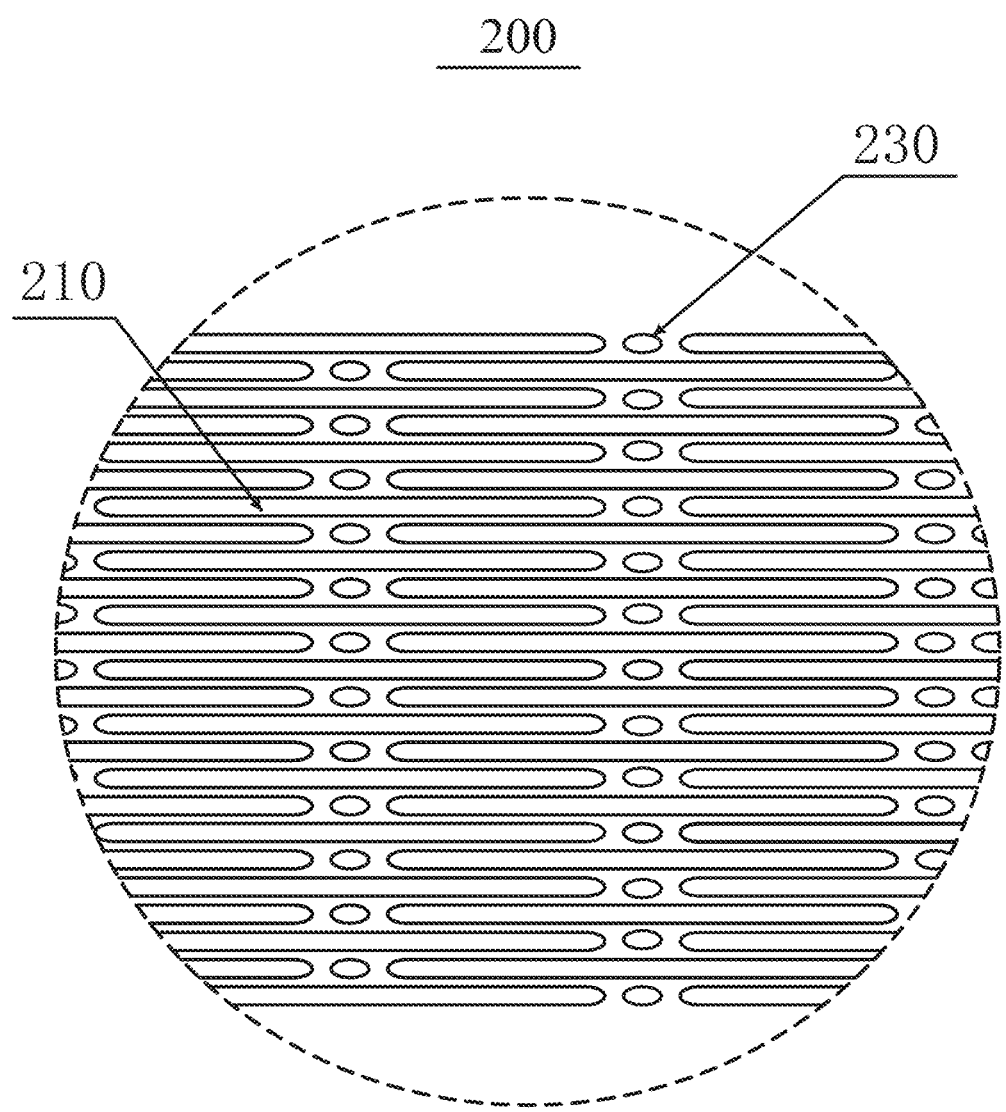
FIG. 3 is a structural schematic diagram of a bending region in FIG. 2.
Figure 4:
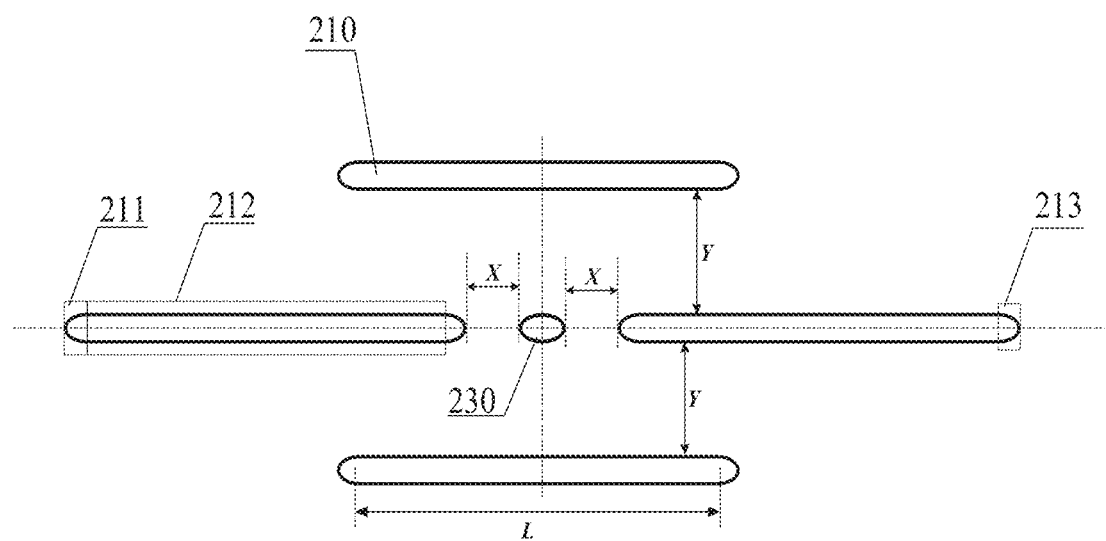
FIG. 4 is an enlarged structural schematic diagram of the bending region in FIG. 3.

Please refer to FIGS. 2-4, this embodiment provides a support film layer 20. The support film layer 20 includes a bending region 200 and non-bending region 100 positioned on two opposite sides of the bending region 200. The bending region 200 includes at least one elliptical hollow structure 230 and a plurality of shuttle-shaped hollow structures 210, which are arranged periodically. The elliptical hollow structure 230 and the shuttle-shaped hollow structures 210 have a same width direction. The elliptical hollow structure 230 and the shuttle-shaped hollow structures 210 have a same length direction. The width direction is a bending direction of the support film layer 20. Each of the shuttle-shaped hollow structures 210 includes a first semi-elliptical hollow structure 211, a rectangular hollow structure 212, and a second semi-elliptical hollow structure 213, which are sequentially connected to each other along the length direction. In the length direction, the elliptical hollow structure 230 is disposed between two adjacent first semi-elliptical hollow structures 211 and/or second semi-elliptical hollow structures 213. In the width direction, the elliptical hollow structure 230 is disposed between two adjacent rectangular hollow structures 212.

It should be explained that both the elliptical hollow structure 230 and the shuttle-shaped hollow structures 210 are formed by an etching process. After processing, they are required to be free of foreign matters, oil stains, and defects, and the bending region 200 after forming is kept flat and has a good appearance without side-etching or over-etching, so as to ensure a uniformity of dimensions of the elliptical hollow structure 230 and the shuttle-shaped hollow structures 210. Furthermore, horizontal and vertical pitches corresponding to the elliptical hollow structure 230 and the shuttle-shaped hollow structures 210 are required to be uniform, and edges are free of burrs, micro cracks, etc. The elliptical hollow structure 230 and the shuttle-like hollow structure 210 are adjacently arranged and are arranged alternately and periodically in the bending region 200. A local modulus of the bending region 200 can be reduced, and a local ductility of the support film layer is enhanced.

By periodically arranging at least one elliptical hollow structure 230 and the plurality of shuttle-shaped hollow structures 210 in the bending region 200 of the support film layer 20, stress concentrations in the bending region 200 can be weakened, which is beneficial to increase a bending lifespan of the support film layer 20 and further reduce or eliminate a risk of partial fracture of the support film layer 20. Understandably, various technical means provided by the present application are optimized designs at least for a purpose of weakening or eliminating a risk of excessive stress concentrations during a bending process, which may cause the support film layer 20 to easily break partially.

Figure 5:
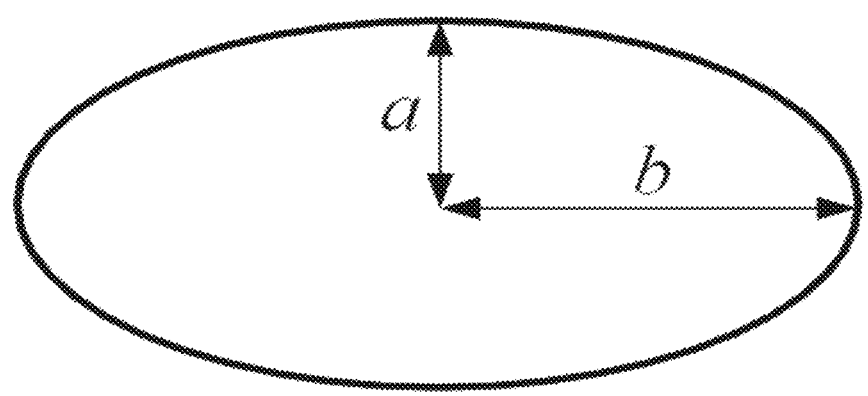
FIG. 5 is a structural schematic diagram of an elliptical hollow structure in FIG. 4.
Figure 6:
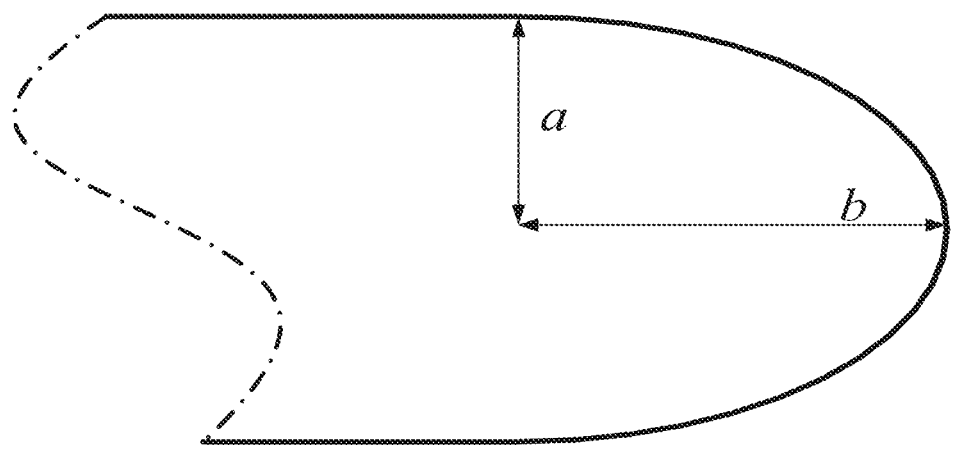
FIG. 6 is a structural schematic diagram of a corresponding semi-elliptical hollow structure in FIG. 4.

Please refer to FIGS. 4-6. In an embodiment, the first semi-elliptical hollow structure 211 is same as half of the elliptical hollow structure 230 in the length direction, and the second semi-elliptical hollow structure 213 is same as another half of the elliptical hollow structure 230 in the length direction.

Understandably, a state that the first semi-elliptical hollow structure 211 and the second semi-elliptical hollow structure 213 are connected and combined is consistent with the elliptical hollow structure 230. Moreover, the first semi-elliptical hollow structure 211 and the second semi-elliptical hollow structure 213 each account for one-half of the elliptical hollow structure 230. This structure configuration can further weaken or eliminate the excessive stress concentrations during the bending process, which is beneficial to increase the bending lifespan of the support film layer 20 and further reduce or eliminate the risk of the partial fracture of the support film layer 20.

Please refer to FIG. 4. In an embodiment, a width of the rectangular hollow structure 212 is twice that of a semi-minor axis of the elliptical hollow structure 230. In other words, in respective length directions, the elliptical hollow structure 230 and the corresponding rectangular hollow structure 212 are overlapped with their center extensions line in the length direction. The rectangular hollow structure 212 is externally connected to the first semi-elliptical hollow structure 211 and/or the second semi-elliptical hollow structure 213.

Figure 9:
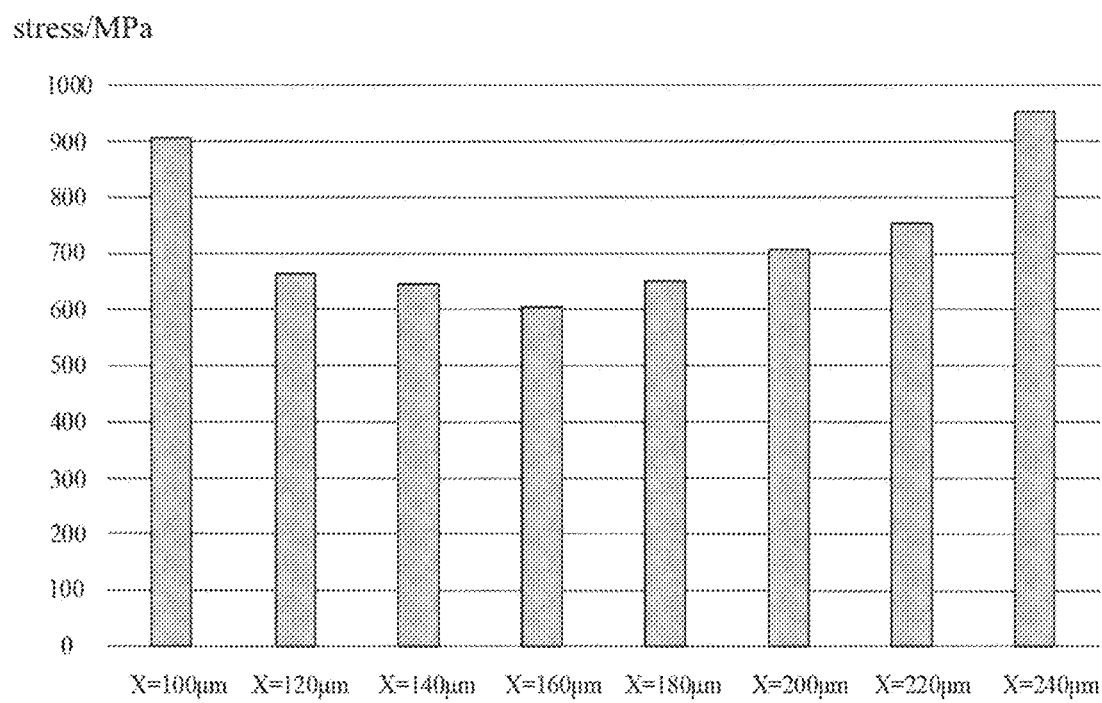
FIG. 9 is a schematic diagram of a trend of a distance X and a local stress.

Please refer to FIGS. 4 and 9. In an embodiment, with a distance X, in the length direction, between adjacent elliptical hollow structure 230 and first semi-elliptical hollow structure 211 or second semi-elliptical hollow structure 213 changes from 100 μm to 240 μm, a local peak stress drops first and then rises. This shows that the distance X between the adjacent elliptical hollow structure 230 and first semi-elliptical hollow structure 211 or second semi-elliptical hollow structure 213 has a better selection range, which means that neither greater nor lesser of the distance X is better. As the distance X between the adjacent elliptical hollow structure 230 and first semi-elliptical hollow structure 211 or second semi-elliptical hollow structure 213 sequentially increases from 100 μm, 120 μm, and 140 μm to 160 μm, the local peak stress drops from about 900 MPa to about 600 MPa. As the distance X between the adjacent elliptical hollow structure 230 and first semi-elliptical hollow structure 211 or second semi-elliptical hollow structure 213 sequentially increases from 160 μm, 180 μm, and 200 μm to 220 μm, the local peak stress rises from about 600 MPa to about 950 MPa. Therefore, as a better choice, the distance X between the adjacent elliptical hollow structure 230 and first semi-elliptical hollow structure 211 or second semi-elliptical hollow structure 213 can be selected within a range of 120 μm to 180 μm. Of course, as a better treatment solution to weaken the local peak stress, it can also be chosen to be around 160 μm.

It should be explained that the above simulation data is a correspondence trend chart based on a configuration that a length L of the rectangular hollow structure 212 is 4.2 mm, a distance Y between two adjacent rectangular hollow structures 212 is 0.08 mm, the semi-minor axis a of the elliptical hollow structure 230 is 0.1 mm, and a semi-major axis b of the elliptical hollow structure 230 is 0.2 mm.

Figure 10:
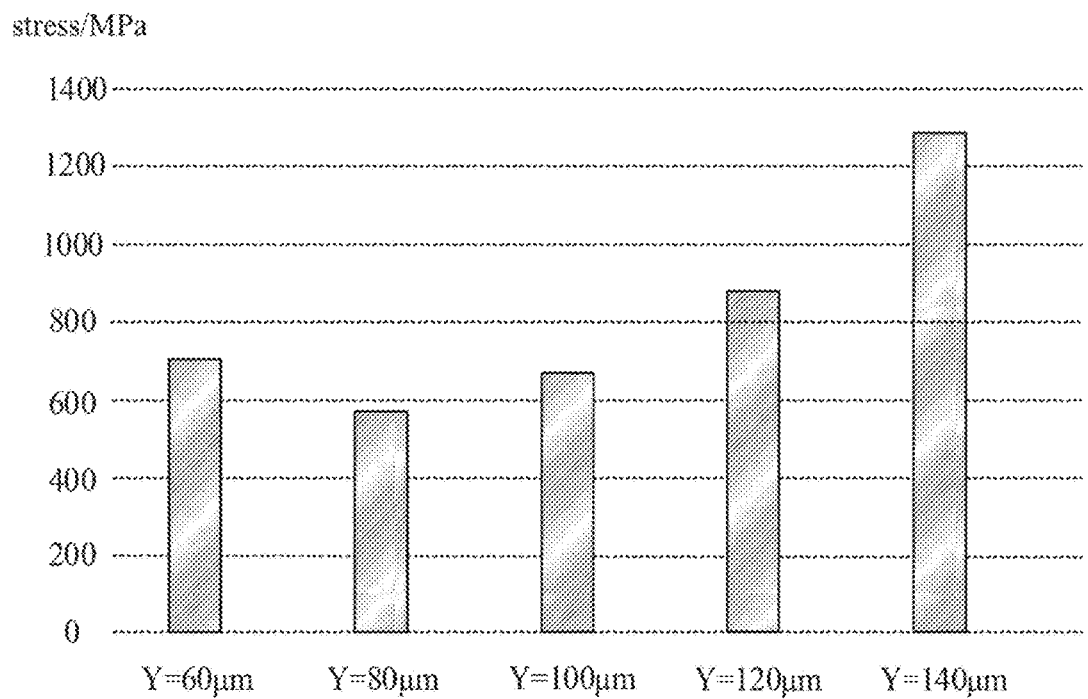
FIG. 10 is a schematic diagram of a trend of a distance Y and a local stress.

Please refer to FIGS. 4 and 10. In an embodiment, as the distance Y between two adjacent rectangular hollow structures 212 increases from 60 μm to 140 μm, a local peak stress drops first and then rises. This shows that the distance Y between the two adjacent rectangular hollow structures 212 has a better selection range, which means that neither greater nor lesser of the distance Y is better. As the distance Y between the two adjacent rectangular hollow structures 212 increases from 60 μm to 80 μm, the local peak stress drops from about 800 MPa to about 600 MPa. As the distance Y between the two adjacent rectangular hollow structures 212 increases from 80 μm, 100 μm, and 120 μm to 140 μm, the local peak stress rises from about 600 MPa to about 1300 MPa. Therefore, as a better choice, the distance Y between the two adjacent rectangular hollow structures 212 can be selected within a range of 60 μm to 100 μm. Of course, as a better treatment solution to weaken the local peak stress, it can also be chosen to be around 80 μm.

It should be explained that the above simulation data is a correspondence trend chart based on a configuration that the length L of the rectangular hollow structure 212 is 4.2 mm, the distance X between the adjacent elliptical hollow structure 230 and first semi-elliptical hollow structure 211 or second semi-elliptical hollow structure 213 is 0.16 mm, the semi-minor axis a of the elliptical hollow structure 230 is 0.1 mm, and the semi-major axis b of the elliptical hollow structure 230 is 0.2 mm.

Figure 11:
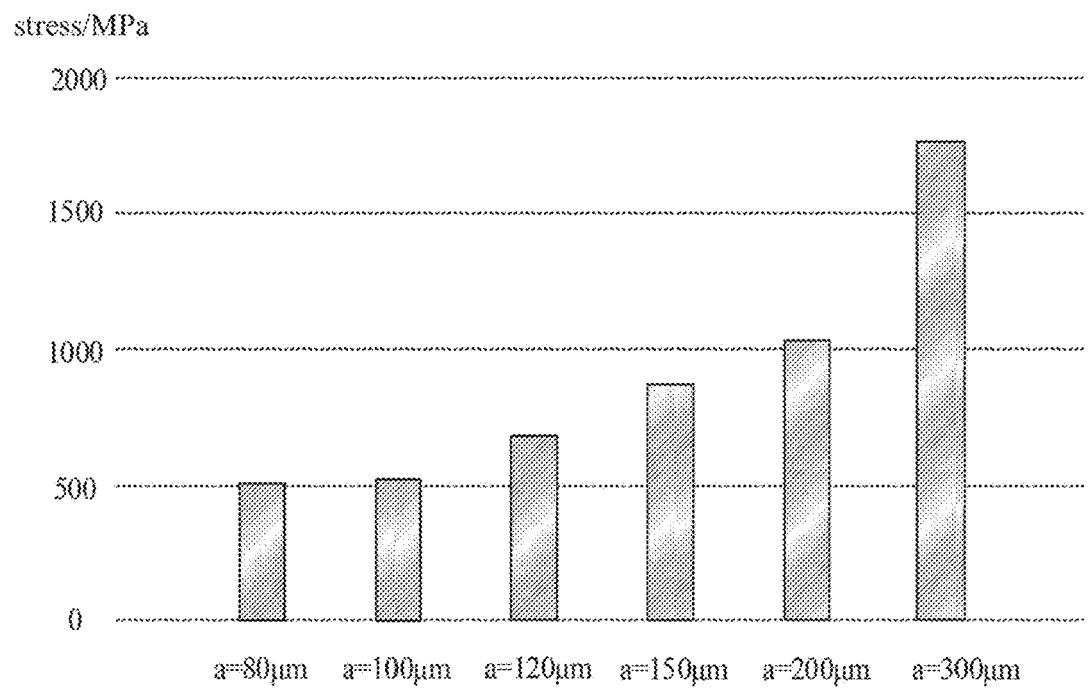
FIG. 11 is a schematic diagram of a trend of a length L and the local stress.

Please refer to FIGS. 5, 6, and 11. In an embodiment, as the semi-minor axis a of the elliptical hollow structure 230 increases from 80 μm to 300 μm, a local peak stress rises from about 500 MPa to about 1750 MPa. This shows that a lesser semi-minor axis of the elliptical hollow structure 230 is better. Therefore, as a better choice, the semi-minor axis of the elliptical hollow structure 230 can be selected within a range of 80 μm to 120 μm. Of course, as a better treatment solution to weaken the local peak stress, it can also be chosen to be around 100 μm.

It should be explained that the above simulation data is a correspondence trend chart based on a configuration that the length L of the rectangular hollow structure 212 is 4.2 mm, the distance X between the adjacent elliptical hollow structure 230 and first semi-elliptical hollow structure 211 or second semi-elliptical hollow structure 213 is 0.16 mm, the distance Y between the two adjacent rectangular hollow structures 212 is 0.08 mm, and the semi-major axis b of the elliptical hollow structure 230 is 0.2 mm. The semi-minor axis a of the elliptical hollow structure 230 can be, but is not limited to, same as a semi-minor axis of the first semi-elliptical hollow structure 211 or a semi-minor axis of the second semi-elliptical hollow structure 213.

Figure 12:
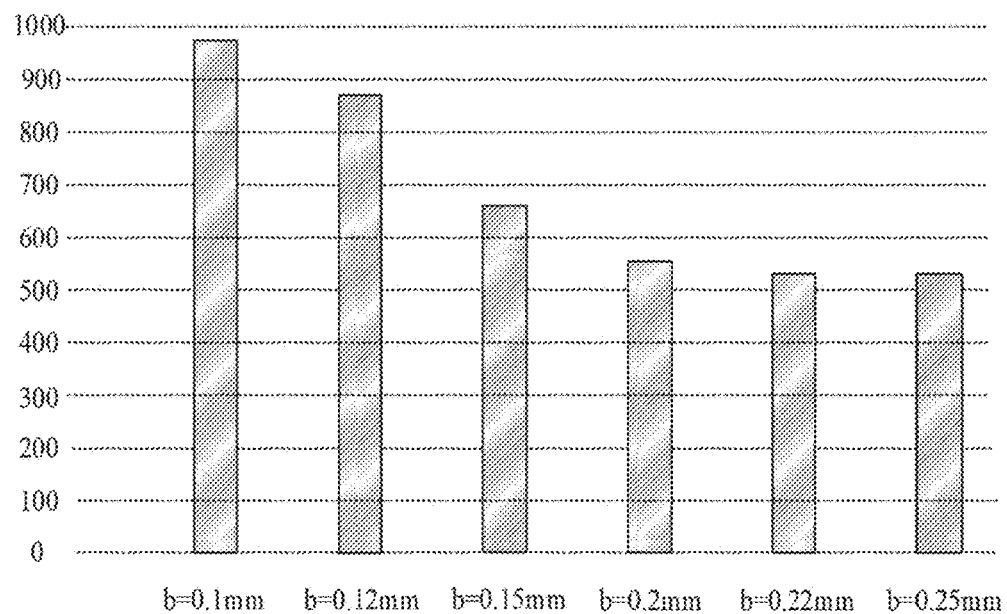
FIG. 12 is a schematic diagram of a trend of a semi-minor axis and the local stress.

Please refer to FIGS. 5, 6, and 12. In an embodiment, as the semi-major axis b of the elliptical hollow structure 230 increases from 0.1 mm to 0.25 mm, a local peak stress drops from about 980 MPa to about 540 MPa. This shows that a greater semi-major axis b of the elliptical hollow structure 230 is better. Therefore, as a better choice, the semi-major axis b of the elliptical hollow structure 230 can be selected within a range of 0.2 mm or more. Of course, as a better treatment solution to weaken the local peak stress, it can also be chosen to be around 0.12 mm, 0.15 mm, or 0.22 mm.

It should be explained that the above simulation data is a correspondence trend chart based on a configuration that the length L of the rectangular hollow structure 212 is 4.2 mm, the distance X between the adjacent elliptical hollow structure 230 and first semi-elliptical hollow structure 211 or second semi-elliptical hollow structure 213 is 0.16 mm, the distance Y between the two adjacent rectangular hollow structures 212 is 0.08 mm, and the semi-minor axis a of the elliptical hollow structure 230 is 0.1 mm. The semi-major axis b of the elliptical hollow structure 230 can be, but is not limited to, same as a semi-major axis of the first semi-elliptical hollow structure 211 or a semi-major axis of the second semi-elliptical hollow structure 213.

Figure 13:
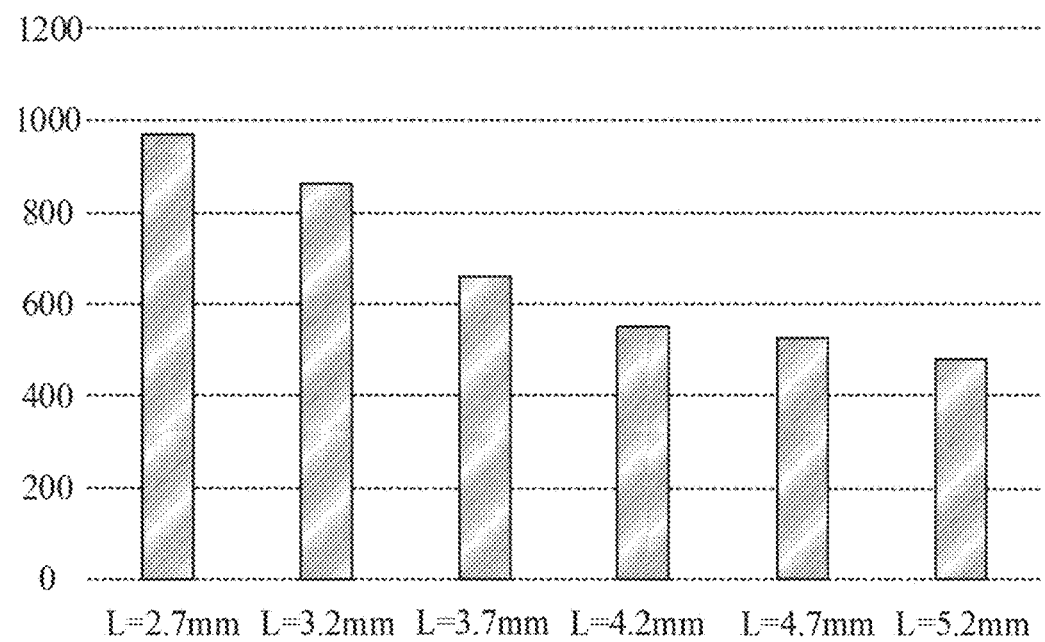
FIG. 13 is a schematic diagram of a trend of a semi-major axis b and the local stress.

Please refer to FIGS. 4 and 13. In an embodiment, as the length L of the rectangular hollow structure 212 increases, a local peak stress experienced by the support film layer 20 during the bending process gradually decreases. The length L of the rectangular hollow structure 212 can be selected within a range of 2.7 mm to 5.2 mm. When the length L of the rectangular hollow structure 212 is 2.7 mm, a corresponding local peak stress is about 1100 MPa. When the length L of the rectangular hollow structure 212 is 3.2 mm, a corresponding local peak stress is about 930 MPa. When the length L of the rectangular hollow structure 212 is 3.7 mm, a corresponding local peak stress is about 680 MPa. When the length L of the rectangular hollow structure 212 is 4.2 mm, a corresponding local peak stress is about 580 MPa. When the length L of the rectangular hollow structure 212 is 4.7 mm, a corresponding local peak stress is about 520 MPa. When the length L of the rectangular hollow structure 212 is 5.2 mm, a corresponding local peak stress is about 480 MPa. Therefore, considering an optimization of the local peak stress, the length L of the rectangular hollow structure 212 can be selected to be greater than or equal to 2.7 mm. Also, the length L of a corresponding rectangular hollow structure 212 can be selected according to an amount of the local peak stress that the support film layer 20 can adapt to.

It should be explained that the above simulation data is a correspondence trend chart based on a configuration that the semi-major axis b of the elliptical hollow structure 230 is 0.2 mm, the distance X between the adjacent elliptical hollow structure 230 and first semi-elliptical hollow structure 211 or second semi-elliptical hollow structure 213 is 0.16 mm, the distance Y between the two adjacent rectangular hollow structures 212 is 0.08 mm, and the semi-minor axis a of the elliptical hollow structure 230 is 0.1 mm.

In summary, in the present application, the bending region 200 of the support film layer 20 adopts a combined design of patterned and periodically arranged elliptical hollow structure 230 and shuttle-shaped hollow structures 210, which effectively reduces an elastic modulus of the bending region 200 and increase a ductility of the bending region 200. However, with an introduction of periodic hole design, certain stress concentrations still occur to connection positions between the elliptical hollow structure 230 and the shuttle-shaped hollow structures 210 during the bending process. Interconnection portions between the elliptical hollow structure 230 and the shuttle-shaped hollow structures 210 are relatively fragile and are prone to fracture during the bending process. Therefore, the present application combines a simulation optimization method to reasonably design the above eigenvalues of the distance X between the adjacent elliptical hollow structure 230 and first semi-elliptical hollow structure 211 or second semi-elliptical hollow structure 213, the distance Y between the two adjacent rectangular hollow structures 212, the length L of the rectangular hollow structure 212, the semi-minor axis a of the elliptical hollow structure 230, and the semi-major axis b of the elliptical hollow structure 230, so as to minimize a risk of fracture failure.

Figure 7:
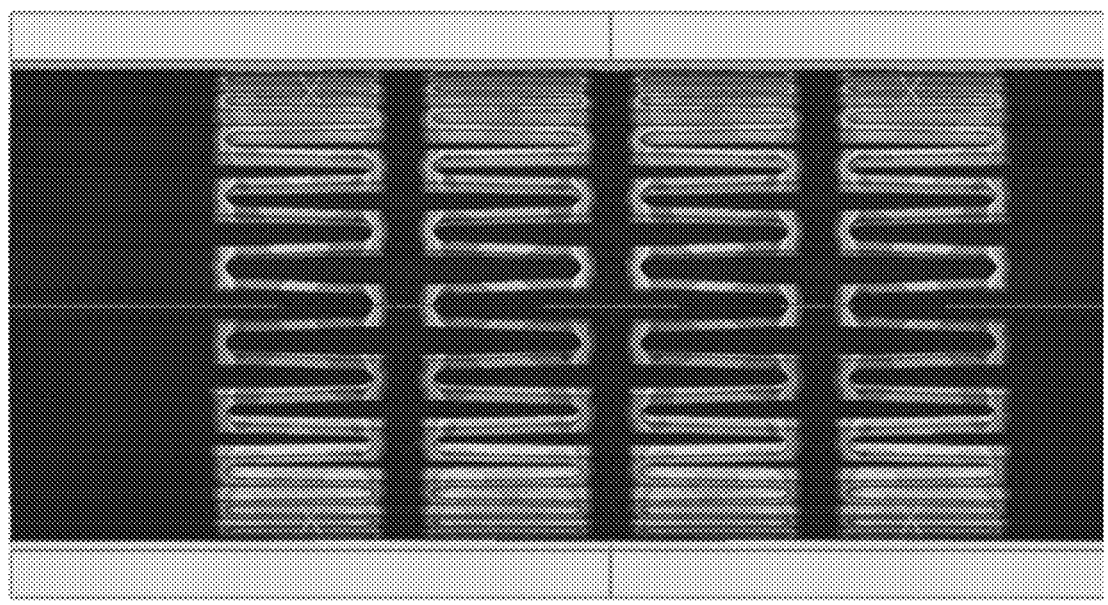
FIG. 7 is a partial simulation diagram when a module lamination structure is bent.

Please refer to FIG. 7. FIG. 7 shows a partial simulation diagram of the bending region 200 when a module lamination structure is bent with a radius of R=1.5 mm. It can be seen that stress concentrations mainly occur to the connection positions between the elliptical hollow structure 230 and the shuttle-shaped hollow structures 210. In other words, the connection positions can be understood as positions of a main risk point.

Figure 8:
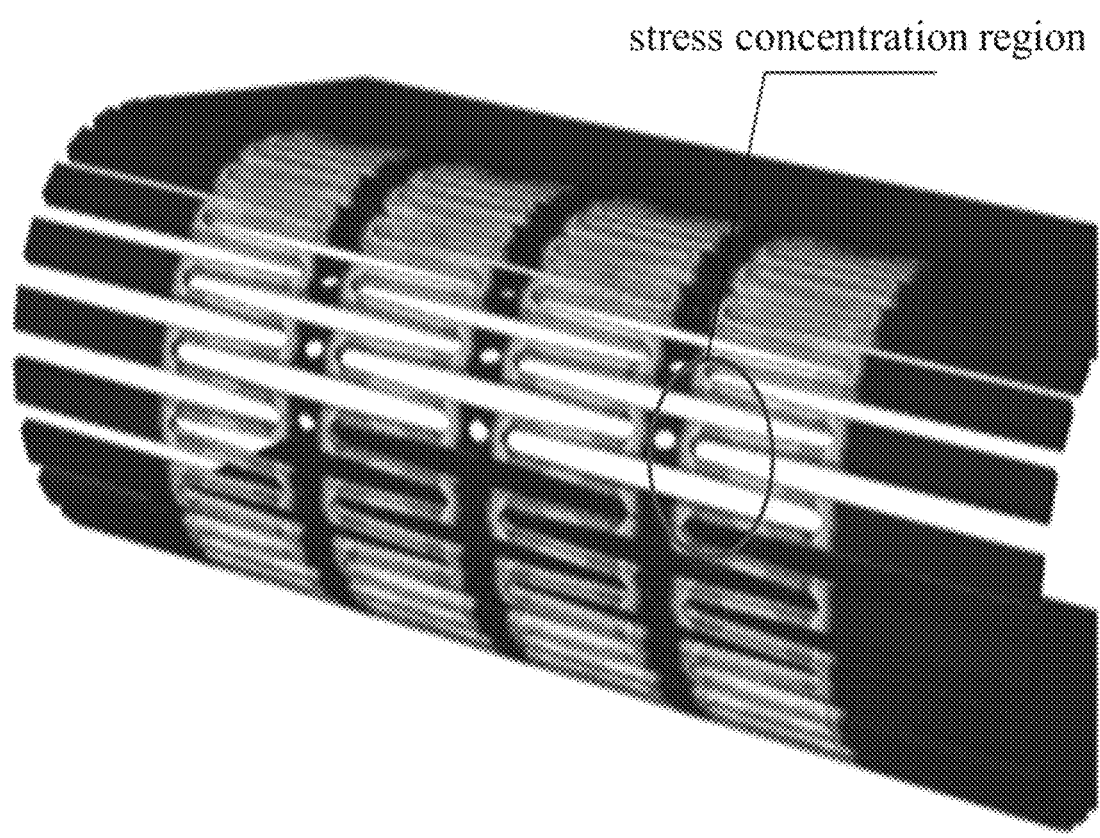
FIG. 8 is a stress simulation diagram when the support film layer is bent.

Please refer to FIG. 8. FIG. 8 is a stress simulation diagram when the support film layer 20 is bent. It can also be seen that the stress concentration occurs to the connection positions between the elliptical hollow structure 230 and the shuttle-shaped hollow structures 210. Similarly, it can be seen that during the bending process of the module lamination structure, the stress concentrations are mainly caused by relative size transition of the connection positions between the elliptical hollow structure 230 and the shuttle-shaped hollow structures 210. Therefore, the present application combines a finite element simulation method to optimize and verify sizes and shapes of the above the distance X between the adjacent elliptical hollow structure 230 and first semi-elliptical hollow structure 211 or second semi-elliptical hollow structure 213, the distance Y between the two adjacent rectangular hollow structures 212, the length L of the rectangular hollow structure 212, the semi-minor axis a of the elliptical hollow structure 230, and the semi-major axis b of the elliptical hollow structure 230. With this method, it can indeed solve a stress concentration problem and minimize the stress concentrations.

Figure 1:
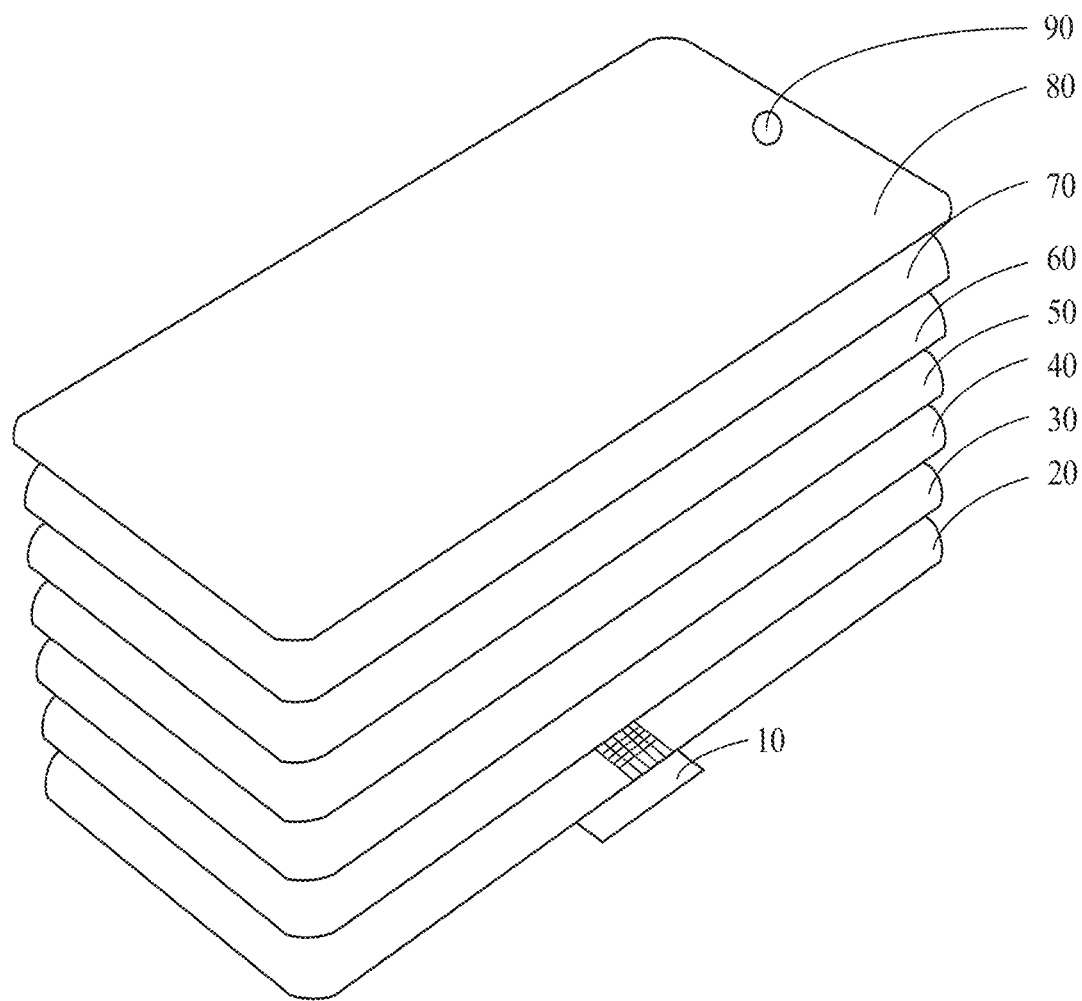
FIG. 1 is a structural schematic diagram of a flexible display panel provided by an embodiment of the present invention.

In an embodiment, referring to FIG. 1, the present application provides a flexible display panel including a flexible substrate 40 and the support film layer 20 according to any one of the above embodiments disposed on a side of the flexible substrate 40.

In an embodiment, the flexible display panel further includes a protective film layer 10. The protective film layer 10 is disposed on a side of the support film layer 20 away from the flexible substrate 40. The protective film layer 10 at least covers the bending region 200 of the support film layer 20. The protective film layer 10 is a linear elastic material.

In an embodiment, the flexible display panel further includes a buffer layer 30. The buffer layer 30 is disposed between the flexible substrate 40 and the support film layer 20. The buffer layer 30 includes a superelastic material, which has a good energy absorption and buffering effect.

In an embodiment, the flexible display panel further includes a display device layer 50, a polarizer 60, an optical adhesive layer 70, and a protective cover plate 80, which are positioned on the other side of the flexible substrate 40 and are sequentially stacked.

The flexible display panel further includes at least one circular hole 90. The circular hole 90 penetrates the protective film layer 10, the support film layer 20, the buffer layer 30, the flexible substrate 40, the display device layer 50, the polarizer 60, the optical adhesive layer 70, and the protective cover plate 80. The circular hole 90 is disposed in a non-bending region 100 of the support film layer 20. Understandably the circular hole 90 can be, but is not limited to, a camera hole.

It should be explained that moduli of the protective film layer 10, the buffer layer 30, the flexible substrate 40, the polarizer 60, the optical adhesive layer 70, and the protective cover plate 80 are relatively low and have good bendability. The adhesive layer 70 is a typical viscoelastic transparent material. The protective cover plate 80, the polarizer 60, and the flexible substrate 40 are all linear elastic materials.

An elastic modulus of raw material of the support film layer 20 in the present application is 200 GPa. Material of the support film layer 20 is a stainless-steel plate with a low manganese metal content; a thickness thereof can be, but is not limited to, 90 μm to 210 μm and can also be selected as a preferred thickness of 150 μm; a tensile strength thereof ranges 1500 MPa to 2250 MPa and can also be selected around 1850 MPa. In the present application, a middle portion of the support film layer 20 is defined with holes, its surface is smoothed, its surface flatness is controlled within 0.5 mm, its appearance is free of bumps or recesses, and its edges are required to be free of burrs.

In summary, the above support film layer 20 and flexible display panel in the present application can be applied to, but not limited to, tablet phones, flexible folding phones, full-screen phones, and tablet computers, and can also be applied to rollable phones, rollable tablet computers, or various electronic display devices. The present application can improve the ductility of the bending region 200 of a metal support structure, so that a local tensile modulus of an original entire-surface support plate structure is effectively reduced. Therefore, a characteristic of coordinating deformations of the optical adhesive layer 70 adhere to the support film layer during the bending process is realized. In addition, in a process of implementing the present application, the above design of a periodic and special combination hole substructure is reasonably designed with an idea of a shape optimization and a size optimization. Moreover, a simulation design optimization verification method is combined to determine an optimal structure size of the hole substructure, thereby reducing the stress concentrations and reducing the risk of the fracture failure of the support film layer due to excessive local stresses during the bending process. Through implementations of the present application, a yield problem of flexible folding screen modules can be resolve, and reasonable and effective design methods and solutions can be provided for reference Understandably, those having ordinary skills of the art may easily contemplate various changes and modifications of the technical solution and technical ideas of the present invention and all these changes and modifications are considered within the protection scope of right for the present invention.

What is claimed is:

1. A flexible display panel, comprising:
a flexible substrate; and
a support film layer disposed on a side of the flexible substrate,
wherein the support film layer comprises a bending region and non-bending regions on two opposite sides of the bending region;
wherein the bending region comprises at least one elliptical hollow structure and a plurality of shuttle-shaped hollow structures, which are arranged periodically;
wherein the elliptical hollow structure and the shuttle-shaped hollow structures have a same width direction, the elliptical hollow structure and the shuttle-shaped hollow structures have a same length direction, and the width direction is a bending direction of the support film layer;
wherein each of the shuttle-shaped hollow structures comprises a first semi-elliptical hollow structure, a rectangular hollow structure, and a second semi-elliptical hollow structure, which are sequentially connected to each other along the length direction;
wherein in the length direction, the elliptical hollow structure is disposed between two adjacent first semi-elliptical hollow structures and/or second semi-elliptical hollow structures;
wherein in the width direction, the elliptical hollow structure is disposed between two adjacent rectangular hollow structures;
wherein the first semi-elliptical hollow structure is same as half of the elliptical hollow structure in the length direction, and the second semi-elliptical hollow structure is same as another half of the elliptical hollow structure in the length direction; and
wherein a width of the rectangular hollow structure is twice that of a semi-minor axis of the elliptical hollow structure,
wherein in the length direction, a distance between adjacent two of the elliptical hollow structures and the first semi-elliptical hollow structure or the second semi-elliptical hollow structure ranges from 100 µm to 240 µm.

2. The flexible display panel according to claim 1, further comprising a protective film layer;
wherein the protective film layer is disposed on a side of the support film layer away from the flexible substrate, and the protective film layer at least covers the bending region of the support film layer.

3. The flexible display panel according to claim 2, wherein the protective film layer is a linear elastic material.

4. The flexible display panel according to claim 2, further comprising a buffer layer;
wherein the buffer layer is disposed between the flexible substrate and the support film layer, and the buffer layer comprises a superelastic material.

5. The flexible display panel according to claim 1, wherein in the width direction, a distance between two adjacent rectangular hollow structures ranges from 60 µm to 140 µm.

6. The flexible display panel according to claim 5, wherein semi-minor axes of the elliptical hollow structure, the first semi-elliptical hollow structure, and the second semi-elliptical hollow structure range from 0.08 mm to 0.12 mm.

7. The flexible display panel according to claim 6, wherein semi-major axes of the elliptical hollow structure, the first semi-elliptical hollow structure, and the second semi-elliptical hollow structure range from 0.1 mm to 0.25 mm.

8. The flexible display panel according to claim 7, wherein a length of the rectangular hollow structure ranges from 2.7 mm to 5.2 mm.

* * * * *